(12) United States Patent
Takesako (10) Patent No.: US 10,217,748 B2
(45) Date of Patent: Feb. 26, 2019

(54) DYNAMIC RANDOM ACCESS MEMORY AND METHOD OF MANUFACTURING THE SAME

(71) Applicant: Winbond Electronics Corp., Taichung (TW)

(72) Inventor: Kazuaki Takesako, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/604,684

(22) Filed: May 25, 2017

(65) Prior Publication Data

US 2018/0342517 A1 Nov. 29, 2018

(51) Int. Cl.
| | |
|---|---|
| H01L 27/108 | (2006.01) |
| H01L 23/522 | (2006.01) |
| H01L 23/528 | (2006.01) |
| H01L 23/532 | (2006.01) |
| H01L 21/768 | (2006.01) |
| H01L 21/311 | (2006.01) |

(52) U.S. Cl.
CPC .. *H01L 27/10814* (2013.01); *H01L 21/31111* (2013.01); *H01L 21/31116* (2013.01); *H01L 21/7687* (2013.01); *H01L 21/76805* (2013.01); *H01L 23/5226* (2013.01); *H01L 23/5283* (2013.01); *H01L 23/53257* (2013.01); *H01L 23/53271* (2013.01); *H01L 27/10855* (2013.01); *H01L 27/10885* (2013.01)

(58) Field of Classification Search
CPC .................................................. H01L 27/10814
See application file for complete search history.

(56) References Cited

U.S. PATENT DOCUMENTS

| | | | |
|---|---|---|---|
| 6,340,615 B1 | 1/2002 | Iyer et al. | |
| 6,483,141 B2 | 11/2002 | Sano | |
| 2004/0166668 A1* | 8/2004 | Ito ..................... | H01L 21/76804 438/637 |
| 2007/0241380 A1* | 10/2007 | Hasunuma .......... | H01L 27/0207 257/296 |
| 2008/0121960 A1* | 5/2008 | Ohuchi ............... | H01L 21/7687 257/296 |

(Continued)

FOREIGN PATENT DOCUMENTS

EP           0986101         3/2000

*Primary Examiner* — Victoria K. Hall
(74) *Attorney, Agent, or Firm* — JCIPRNET (57) ABSTRACT

A dynamic random access memory (DRAM) includes a substrate, a bit line, a capacitor contact, a dielectric structure, a capacitor, and a landing pad. The bit line is located on the substrate. The capacitor contact is aside the bit line. The capacitor contact protrudes from a space between adjacent bit lines, such that upper sidewalls of the capacitor contact are exposed by the bit line. The dielectric structure is located on the upper surface of the bit line and extending to one portion of the upper sidewalls of the capacitor contacts. The capacitor is located above the capacitor contact. The landing pad is located between the capacitor contact and the capacitor. The landing pad at least covers one portion of the upper surface of the capacitor contact. A contact area between landing pad and the capacitor contact is greater than a contact area between the landing pad and the capacitor.

20 Claims, 10 Drawing Sheets

(56) References Cited

U.S. PATENT DOCUMENTS

| | | | |
|---|---|---|---|
| 2009/0020879 A1* | 1/2009 | Lee | H01L 21/76895 |
| | | | 257/773 |
| 2009/0085083 A1* | 4/2009 | Shin | H01L 21/76804 |
| | | | 257/297 |
| 2010/0148236 A1* | 6/2010 | Kadoya | H01L 27/10814 |
| | | | 257/306 |
| 2011/0183512 A1* | 7/2011 | Cho | H01L 21/76831 |
| | | | 438/627 |
| 2013/0214338 A1* | 8/2013 | Mikasa | H01L 29/7827 |
| | | | 257/296 |
| 2013/0234242 A1* | 9/2013 | Hwang | H01L 27/10876 |
| | | | 257/330 |
| 2014/0291804 A1* | 10/2014 | Kim | G11C 11/4099 |
| | | | 257/532 |
| 2014/0367825 A1* | 12/2014 | Kim | H01L 29/0649 |
| | | | 257/522 |
| 2015/0132942 A1* | 5/2015 | Kim | H01L 27/10814 |
| | | | 438/618 |
| 2015/0214291 A1* | 7/2015 | Park | H01L 24/02 |
| | | | 257/503 |
| 2015/0228574 A1* | 8/2015 | Kim | H01L 21/76895 |
| | | | 257/773 |
| 2015/0364366 A1* | 12/2015 | Kim | H01L 21/76816 |
| | | | 438/396 |
| 2015/0364474 A1* | 12/2015 | Kang | H01L 27/10823 |
| | | | 257/306 |
| 2016/0064277 A1* | 3/2016 | Park | H01L 27/10817 |
| | | | 438/386 |
| 2017/0084615 A1* | 3/2017 | Lee | H01L 27/10823 |
| 2018/0083010 A1* | 3/2018 | Kusumoto | H01L 27/10823 |

* cited by examiner

DYNAMIC RANDOM ACCESS MEMORY AND METHOD OF MANUFACTURING THE SAME

BACKGROUND OF THE INVENTION

1. Field of the Invention

The present invention generally relates to a memory and a method of manufacturing the same, in particular, to a dynamic random access memory (DRAM) and a method of manufacturing the same.

2. Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines.

With development of technology, electronic products are developed to have design features of lightness, slimness, shortness and smallness. In this case, the critical dimension of the DRAM is also reduced, which results in an increase of the contact resistance between the capacitor contact and the storage capacitor in the DRAM, thereby decreasing the reliability of the DRAM. Once the misalignment of the storage capacitor has occurred, the increase of the contact resistance will be more serious. Therefore, how to decrease the resistance between the capacitor contact and the storage capacitor to improve the reliability of the DRAM will become a very important issue.

SUMMARY OF THE INVENTION

The invention provides a dynamic random access memory (DRAM) and a method of manufacturing the same, which increase the contact area between the capacitor contact and the storage capacitor, thereby decreasing the contact resistance between the capacitor contact and the storage capacitor.

The invention provides a dynamic random access memory (DRAM) and a method of manufacturing the same, which increase the overlay margin between the capacitor contact and the storage capacitor to enhance the yield and the reliability of the DRAM.

The DRAM of the invention includes a substrate, a bit line, a capacitor contact, a dielectric structure, a capacitor, and a landing pad. The bit line is located on the substrate. The capacitor contact is located aside the bit line. An upper surface of the capacitor contact is higher than an upper surface of bit line, such that upper sidewalls of the capacitor contact are exposed by the bit line. The dielectric structure is located on the upper surface of the bit line and extending to one portion of the upper sidewalls of the capacitor contacts. The capacitor is located above and electrically contacted to the capacitor contact. The landing pad is located between the capacitor contact and the capacitor to electrically connect the capacitor contact and the capacitor together. The landing pad at least covers one portion of the upper surface of the capacitor contact. A contact area between landing pad and the capacitor contact is greater than a contact area between the landing pad and the capacitor.

In an embodiment of the invention, the landing pad completely covers the upper surface of the capacitor contact.

In an embodiment of the invention, the dielectric structure completely covers the upper sidewalls of the capacitor contact.

In an embodiment of the invention, the landing pad further extends to another portion of the upper sidewalls of the capacitor contact.

In an embodiment of the invention, the capacitor offsets from the center of the capacitor contact, so that the landing pad only covers one of the upper sidewalls of the capacitor contact.

In an embodiment of the invention, the number of the bit line is plural, the number of the capacitor contact is plural, and the number of the capacitor is plural, wherein the capacitor contacts are respectively located between the bit line.

In an embodiment of the invention, each of the two dielectric structures includes a first liner layer and a second liner layer over the first liner layer. A material of the first liner layer is different from a material of the second liner layer.

In an embodiment of the invention, the first liner layer includes silicon oxide. The second liner layer includes silicon nitride.

In an embodiment of the invention, an upper surface of the dielectric structure is higher than an upper surface of the landing pad.

In an embodiment of the invention, a height difference between the upper surface of the capacitor contact and the upper surface of the bit line is 10 nm to 50 nm.

In an embodiment of the invention, the capacitor contact includes a first portion and a second portion over the first portion. A material of the first portion is different from a material of the second portion.

In an embodiment of the invention, the first portion includes poly-Si, SiGe, SiC or a combination thereof. The second portion includes W, TiN, TaN or a combination thereof.

The method of manufacturing the DRAM of the invention includes following steps. A plurality of bit lines are formed on a substrate. A plurality of capacitor contacts are formed respectively between the bit lines. An upper surface of each of the capacitor contacts is higher than an upper surface of each of the bit lines, such that a plurality of recesses are respectively formed on the bit lines between the capacitor contacts. A first liner layer is formed on the substrate. The first liner layer conformally covers the upper surfaces of the capacitor contacts and the recesses. A second liner layer is formed on the first liner layer, while the recesses are filled with the second liner layer. A dielectric layer is formed on the second liner layer. A plurality of first openings are formed in the first liner layer and a plurality of second openings are formed in the dielectric layer and the second liner layer. The second openings are respectively located over and connected to the first openings. Each of the first openings exposes one portion of the upper surface of a respective capacitor contact. A width of each of the first openings is greater than a width of each of the second openings. A plurality of landing pads are formed in the first openings. A plurality of capacitors are formed in the second openings. A contact area between each of the landing pads and a respective capacitor contact is greater than a contact area between each of the landing pad and a respective capacitor.

In an embodiment of the invention, steps of forming the first openings and second openings show as below. An etching process is performed to form a plurality of third openings in the dielectric layer, the second liner layer, and the first liner layer. Each of the third openings has a uniform width or a taper width. A widening etching treatment is performed to remove one portion of the first liner layer exposed by the third openings.

In an embodiment of the invention, the etching process includes a dry etching process. The dry etching process includes reactive ion etching (RIE) process.

In an embodiment of the invention, the widening etching treatment includes using an etchant with hydrofluoric acid (HF) and dilute hydrofluoric acid (DHF).

In an embodiment of the invention, the first openings completely expose the upper surfaces of the capacitor contacts.

In an embodiment of the invention, the first openings completely expose the upper surfaces of the capacitor contacts, so that an upper surface of the first liner layer are co-planar with the upper surfaces of the capacitor contacts.

In an embodiment of the invention, the first openings completely expose the upper surfaces of the capacitor contacts and one portion of upper sidewalls of the capacitor contacts, so that an upper surface of the first liner layer are lower than the upper surfaces of the capacitor contacts.

In an embodiment of the invention, each of the second openings is offsets from the center of a respective capacitor contact, so that each of the first openings only exposes one of the upper sidewalls of the respective capacitor contacts.

Based on the above, the invention provides the DRAM and the method of manufacturing the same including forming a liner layer on a surface of the capacitor contact and removing one portion of the liner layer through a widening etching treatment. A landing pad is formed to cover an upper surface of the capacitor contact and to extend to one portion of upper sidewalls of the capacitor contact. Therefore, the contact area between the capacitor contact and the storage capacitor is increased, thereby decreasing the contact resistance between the capacitor contact and the storage capacitor. Even if the storage capacitor is misaligned, the low contact resistance is able to be maintained. Therefore, the overlay margin between the capacitor contact and the storage capacitor is increased, while the yield and the reliability of the DRAM in the invention is enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

Figure 1:
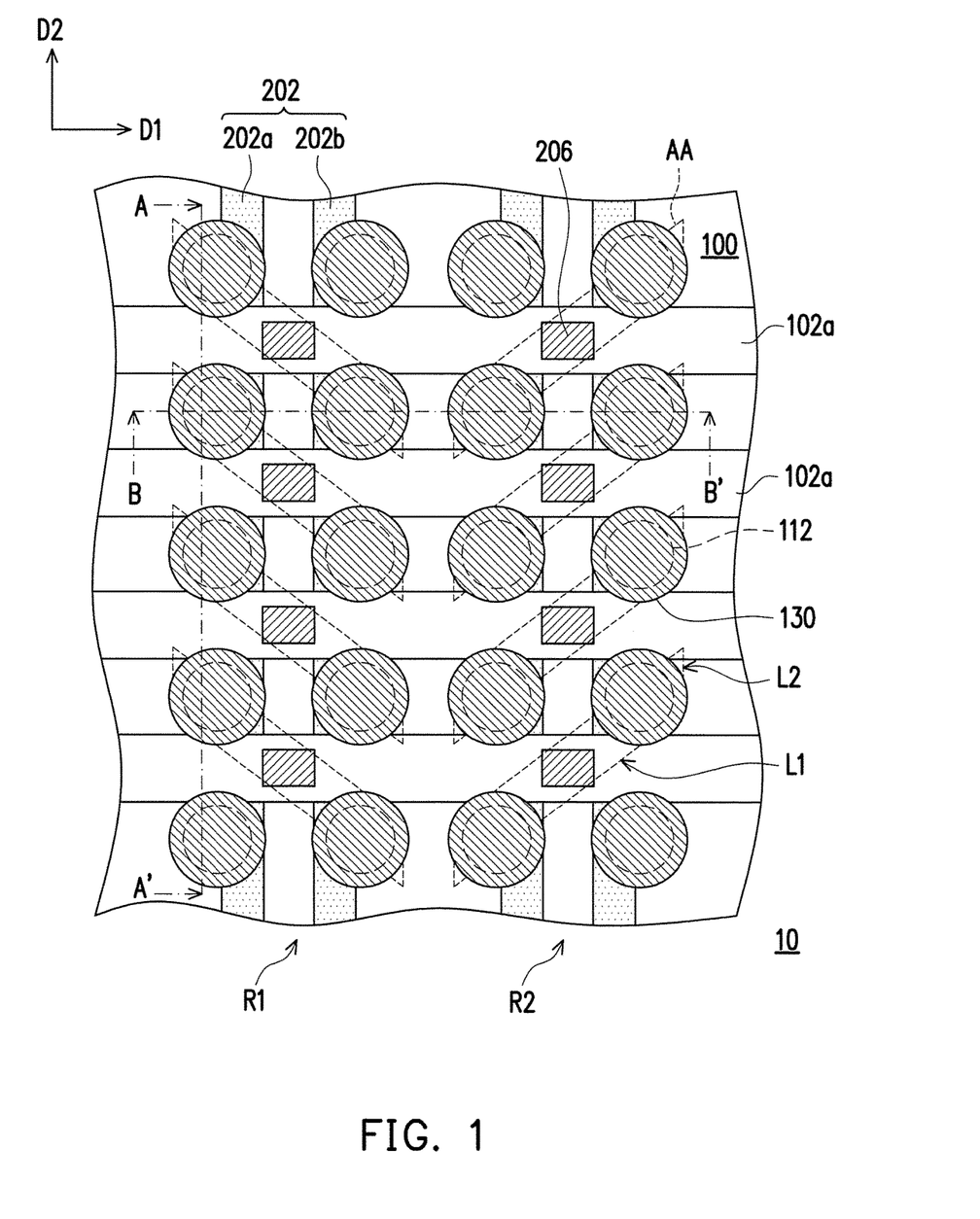
FIG. 1 is a schematic top view of a dynamic random access memory (DRAM) in accordance with a first embodiment of the invention.

FIG. 1 is a schematic top view of a dynamic random access memory (DRAM) in accordance with a first embodiment of the invention.

Referring to FIG. 1, the first embodiment provides the DRAM 10 including a substrate 100, a plurality of active areas AA, a plurality of bit lines 102a, a plurality of word line sets 202, a plurality of capacitor contacts 112, a plurality of capacitors 130 and a plurality of bit line contacts 206. For clarity, only the above components are shown in FIG. 1 while other structures may be shown in the following cross-sectional views of FIG. 2A and FIG. 2B.

The bit lines 102a are located on the substrate 100. The bit lines 102a are extending along the first direction D1 and are alternatively arranged along the second direction D2. The word line sets 202 are located in the substrate 100. The word line sets 202 extend along the second direction D2 and are alternatively arranged along the first direction D1. Each of the word line sets 202 has two buried word lines 202a and 202b. The first direction D1 is different from the second direction D2. In one embodiment, the first direction D1 and the second direction D2 are perpendicular to each other substantially.

The active areas AA are configured into strips and arranged as an array. In some embodiments, the active areas AA are arranged into two active area columns R1 and R2, and the two active area columns R1 and R2 are arranged in a mirrored configuration. However, the invention is not limited thereto. In other embodiments, the two active area columns R1 and R2 are arranged in the same configuration. Each of the active areas AA has long sides L1 and short sides L2, and the long sides L1 cross the corresponding word line set 202 (i.e., two buried word lines 202a and 202b). Also, the overlap between each of the active areas AA and the corresponding bit line 102a has the bit line contact 206. Therefore, each of the bit lines 102a may be electrically connected to the corresponding doped region (not shown) by the bit line contact 206, wherein the doped region is located between the two buried word lines 202a and 202b. In addition, although the bit line contacts 206 are shown as a rectangle in FIG. 1, the contact is formed to be a slight circular shape actually, and the size thereof may be designed according to the process requirement.

The capacitor contacts 112 are located on the short sides L2 of the active areas AA. From another aspect (i.e., along the second direction D2), the capacitor contacts 112 are respectively disposed between the bit lines 102a. Specifically, the capacitor contacts 112 are arranged in a plurality of rows and a plurality of columns. The rows are arranged along the second direction D2 while the columns are arranged along the first direction D1. The capacitors 130 are respectively located on the capacitor contacts 112.

Figure 2A:
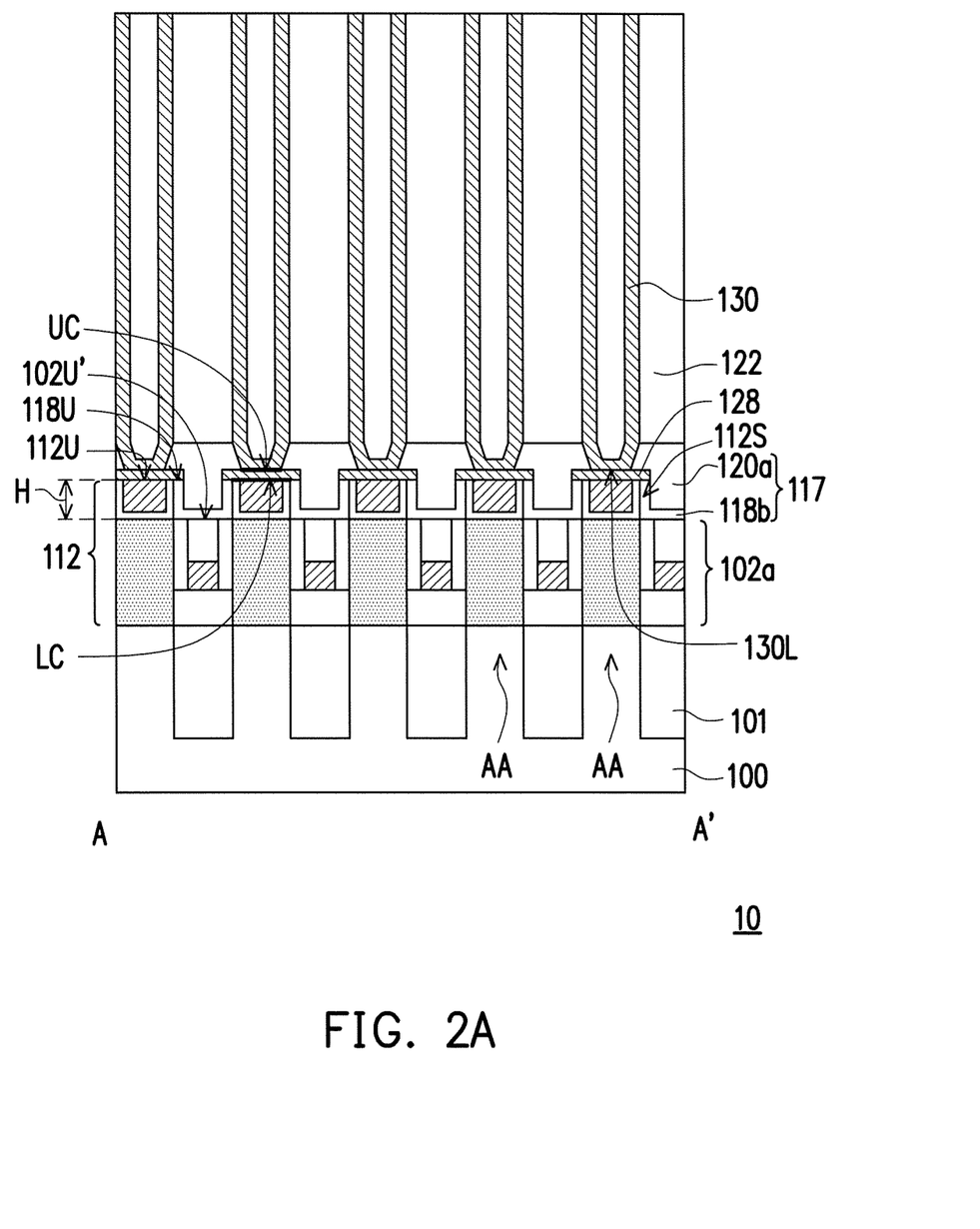
FIG. 2A is a cross-sectional diagram taken along the line section A-A' of FIG. 1.
Figure 2B:
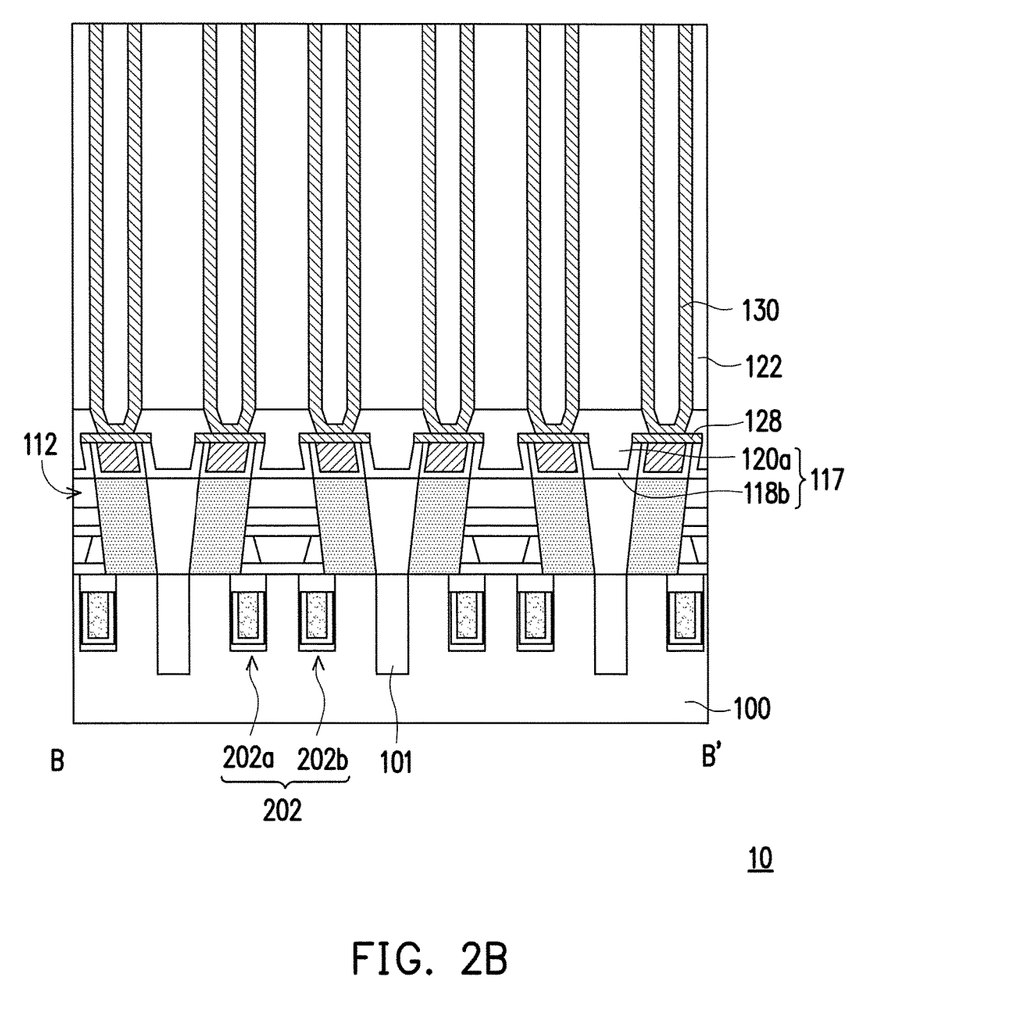
FIG. 2B is a schematic cross-sectional view taken along the line section B-B' of FIG. 1.

FIG. 2A is a cross-sectional diagram taken along the line section A-A' of FIG. 1. FIG. 2B is a schematic cross-sectional view taken along the line section B-B' of FIG. 1.

Referring to FIG. 2A and FIG. 2B, the first embodiment provides the DRAM 10 further including a plurality of isolation structures 101, a plurality of dielectric structures 117, a plurality of landing pads 128, and dielectric layer 122 except for the components shown in FIG. 1.

As shown in FIG. 2A, the isolation structures 101 are located in the substrate 100. In addition, as shown in FIG. 2B, the bottoms of the isolation structures 101 are lower than the bottoms of the word line sets 202 (i.e., buried word lines 202a and 202b). Specifically, the isolation structures 101 and the active areas AA are alternatively arranged along the line section A-A'. The bit lines 102a and the capacitor contacts 112 are also alternatively arranged along the line section A-A'. Upper portions of the capacitor contacts 112 protrude from spaces between the bit lines 102a, such that two sidewalls of the upper portion of each of the capacitor contacts 112 (hereinafter referred to as upper sidewalls 112S of each of the capacitor contacts 112) are exposed by the bit lines 102a. Namely, upper surfaces 112U of the capacitor contacts 112 are higher than upper surfaces 102U' of the bit lines 102a. In some embodiments, a height difference H between the upper surfaces 112U of the capacitor contacts 112 and the upper surfaces 102U' of the bit lines 102a is 10 nm to 50 nm.

The dielectric structures 117 are respectively located on the upper surfaces 102U' of the bit lines 102a. The dielectric structures 117 are extending to and completely cover the upper sidewalls 112S of the capacitor contacts 112. Specifically, each of the dielectric structures 117 includes a first liner layer 118b and a second liner layer 120a. The second liner layer 120a is disposed over the first liner layer 118b. As shown in FIG. 2A, the first liner layer 118b is conformally formed and completely cover on the upper sidewalls 112S of the capacitor contacts 112 exposed by the bit lines 102a. In addition, the first liner layer 118b is further extending to the upper surfaces 102U' of the bit lines 102a. Therefore, the first liner layer 118b is formed as a U shape and disposed on a space among one of the bit lines 102a and the two adjacent capacitor contacts 112. The second liner layer 120a is filled in the space, so that the upper portions of the dielectric structures 117 are higher than the upper portions of the capacitor contacts 112. Further, the dielectric structures 117 are also higher than landing pads 128. In some embodiments, a material of the first liner layer 118b is different from a material of the second liner layer 120a. For example, the first liner layer 118b may be an oxide layer, and the second liner layer 120a may be a nitride layer. In an embodiment, the first liner layer 118b may include silicon oxide, and the second liner layer 120a may include silicon oxynitride. In a preferred embodiment, the first liner layer 118b may include silicon oxide, and the second liner layer 120a may include silicon nitride. However, the invention is not limited thereto.

The landing pads 128 are respectively located on the capacitor contact 112. In the first embodiment, the landing pads 128 completely cover the upper surfaces 112U of the capacitor contacts 112 and are extending to cover the upper surfaces 118U of the first liner layer 118b. In this case, the upper surfaces 118U of the first liner layer 118b is co-planar with the upper surfaces 112U of the capacitor contacts 112.

The capacitors 130 are respectively located on the landing pads 128, so that the landing pads 128 are located between the capacitor contacts 112 and the capacitors 130. The capacitors 130 may be cup-shaped structure which is disposed in the second liner layer 120a and the dielectric layer 122. Since the high aspect ratio of the capacitors 130, each of the capacitors 130 has a taper bottom in the second liner layer 120a.

It should be noted that a contact area LC between one of the landing pads 128 and a respective capacitor contact 112 is greater than a contact area UC between the landing pad 128 and a respective capacitor 130. In other words, the landing pads 128 are able to enlarge or increase contact areas between the capacitor contacts 112 and the capacitors 130, so that the contact resistance between the capacitor contacts 112 and the capacitors 130 is decreased. In some embodiment, the landing pads 128 may be rectangle. The upper surface (or lower surface) of each of the landing pads 128 is greater than the upper surface 112U of each of the capacitor contacts 112 and is greater than the lower surface 130L of each of the capacitors 130.

FIG. 3A to FIG. 3F are schematic cross-sectional views illustrating a process of manufacturing the DRAM taken along the line section A-A' of FIG. 1.

Figure 3A:
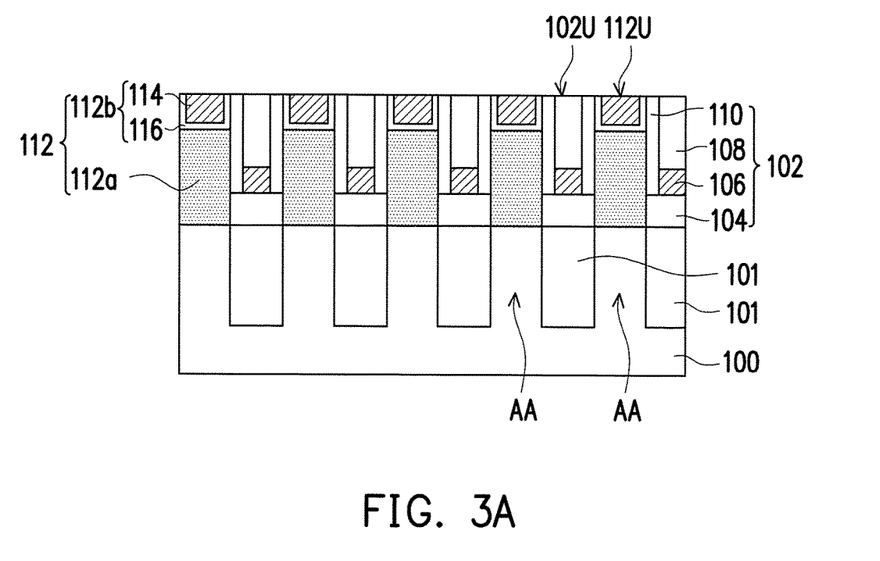
FIG. 3A to FIG. 3F are schematic cross-sectional views illustrating a process of manufacturing the DRAM taken along the line section A-A' of FIG. 1.

Referring to FIG. 3A, the invention provides a method of manufacturing the DRAM 10 including the following steps. First, the substrate 100 is provided. In the embodiment, the substrate 100 may be a semiconductor substrate, a semiconductor compound substrate, or a semiconductor over insulator (SOI) substrate, for example.

Then, the isolation structures 101 are formed in the substrate 100. In some embodiments, the isolation structures 101 may include silicon oxide, HDP oxide, spin-on silicon oxide, low-k dielectric material, or a combination thereof. The isolation structures 101 may be shallow trench isolation (STI) structure, deep trench isolation (DTI) structure, or a combination thereof.

After that, the bit lines 102 are respectively formed on the isolation structures 101. Specifically, each of the bit lines 102 includes a dielectric layer 104, a conductive layer 106, and a cap layer 108 stacked sequentially. In the embodiment, the dielectric layer 104 may include silicon oxide, and be formed by a chemical vapor deposition (CVD) process, a thermal oxidation process, etc. The conductive layer 106 may include W, and be formed by a CVD process, a physical vapor deposition (PVD) process, etc. The cap layer 108 may include silicon nitride, and be formed by a CVD process. The bit lines 102 further includes a spacer 110 disposed on sidewalls of the bit lines 102. The spacer 110 may include silicon oxide, silicon nitride, or a combination thereof.

The capacitor contacts 112 are respectively formed on the active areas AA between the bit lines 102. Specifically, each of the capacitor contacts 112 includes a first portion 112a and a second portion 112b over the first portion 112a. The first portion 112a may include poly-Si, SiGe, SiC or a combination thereof, and be formed by a CVD process, an epitaxial growth process, etc. The second portion 112b includes a conductive layer 114 and a barrier layer 116. The barrier layer 116 is disposed between the conductive layer 114 and the first portion 112a. The barrier layer 116 may include TiN, TaN, or a combination thereof, and be formed by a CVD process. The conductive layer 114 may include W, and be formed by a CVD process, a PVD process, etc. In some embodiments, a material of the first portion 112a is different from a material of the second portion 112b. As shown in FIG. 3A, the upper surfaces 102U of the bit lines 102 are co-planar with the upper surfaces 112U of the capacitor contacts 112 after a planarization process.

Figure 3B:
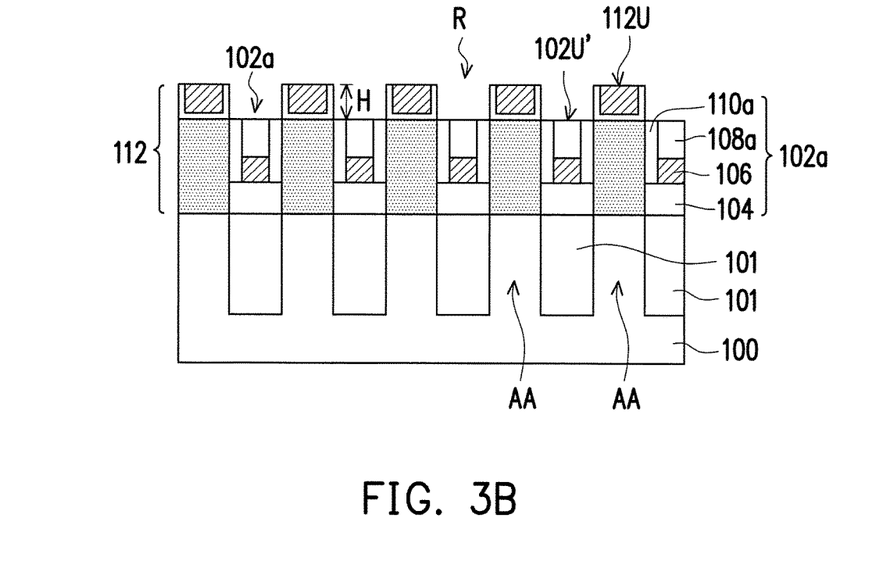

Referring to FIG. 3A and FIG. 3B, parts of bit lines 102 are removed, so that the capacitor contacts 112 are higher than the remaining bit lines 102a. That is, the upper surfaces 112U of the capacitor contacts 112 is higher than the upper surface 102U' of the bit lines 102a, such that a recess R formed on the bit line 102a between two adjacent capacitor contacts 112. In some embodiments, the height difference H between the upper surfaces 112U of the capacitor contacts 112 and the upper surfaces 102U' of the bit lines 102a is 10 nm to 50 nm.

Figure 3C:
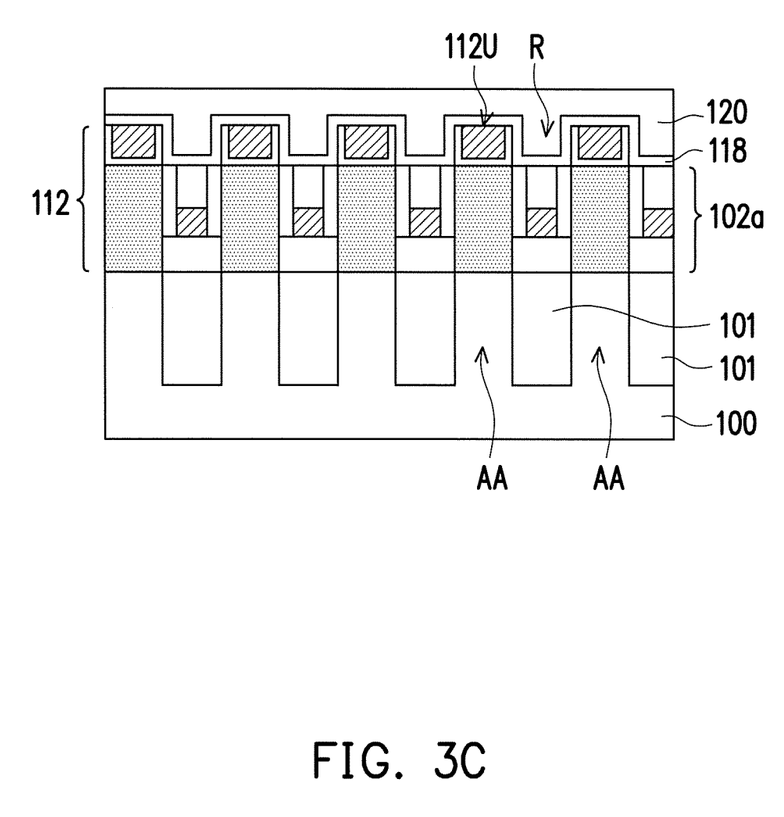

Referring to FIG. 3B and FIG. 3C, a first liner layer 118 is formed on the substrate 100. In detail, the first liner layer 118 conformally covers the upper surfaces 112U of the capacitor contacts 112 and the recesses R. A second liner layer 120 is formed on the first liner layer 118, and the recesses R are filled with the second liner layer 120. In some embodiment, a material of the first liner layer 118 is different from a material of the second liner layer 120. For example, the first liner layer 118 may include silicon oxide, and be formed by a CVD process. In addition, the second liner layer 120 may include silicon nitride, and be formed by a CVD process.

Figure 3D:
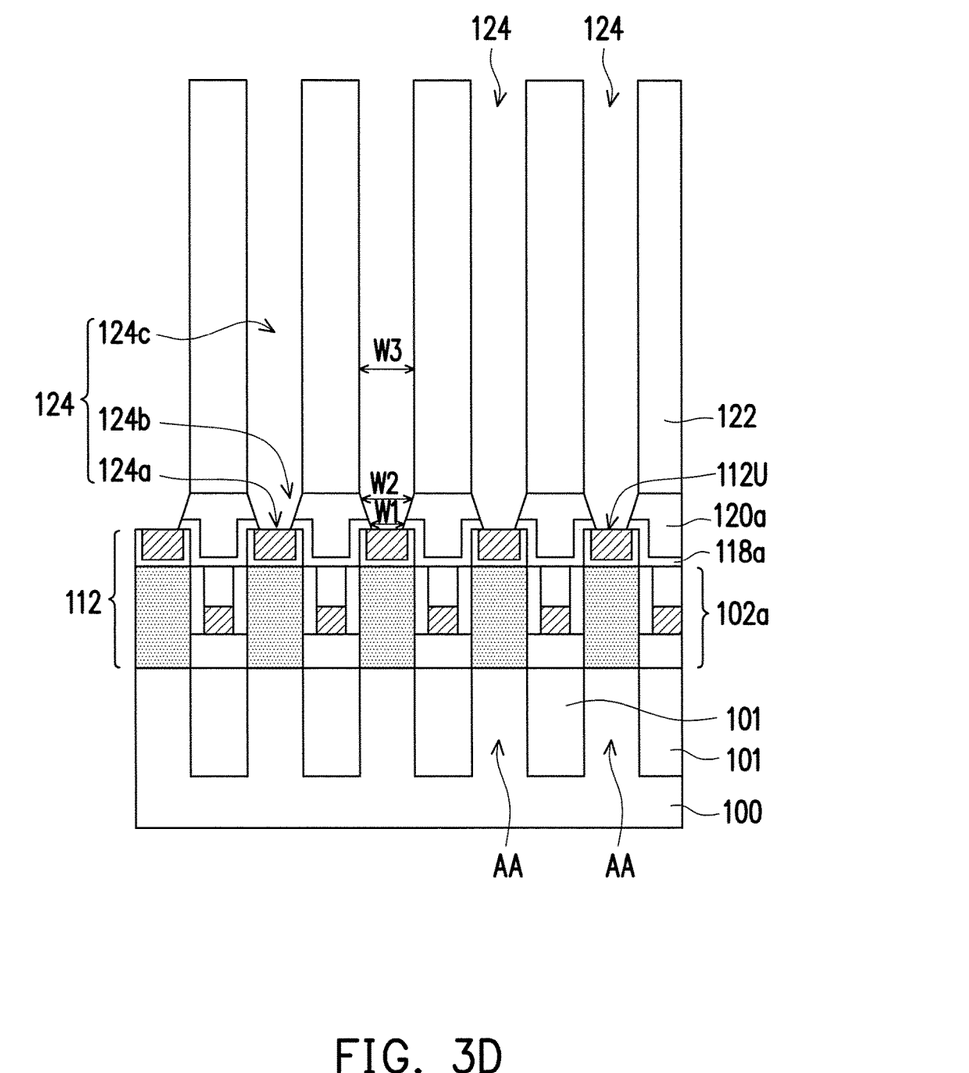

Referring to FIG. 3C and FIG. 3D, after foil ling the second liner layer 120, a dielectric layer 122 is formed on the second liner layer 120. In some embodiments, the dielectric layer 122 may include silicon oxide, silicon nitride, poly-Si or a combination thereof, and be formed by a CVD process. In alternative embodiments, the dielectric layer 122 has an etching rate different from the etching rate of the first liner layer 118a. After that, an etching process is performed, so that a plurality of openings 124a are formed in the first liner layer 118a, a plurality of openings 124b are formed in the second liner layer 120a, and a plurality of openings 124c are formed in the dielectric layer 122. The openings 124a, 124b, and 124c are connected to each other to form openings 124. Parts of the upper surfaces 112U of the capacitor contacts 112 are exposed by the openings 124. As shown in FIG. 3D, the openings 124 including openings 124a, 124b, and 124c may be cup-shaped opening with a taper width. That is, a width W1 of the openings 124a in the first liner layer 118a is less than a width W2 of the openings 124b in the second liner layer 120a, and the width W2 of the openings 124b in the second liner layer 120a is not greater than a width W3 of the openings 124c in the dielectric layer 122. However, the invention is not limited thereto. In other embodiments, the openings 124 may be cup-shaped opening with a uniform width. That is, a width W1 of the openings 124a in the first liner layer 118a, a width W2 of the openings 124b in the second liner layer 120a, and a width W3 of the openings 124c in the dielectric layer 122 are substantially the same. In some embodiments, the etching process includes a dry etching process. The dry etching process may be reactive ion etching (RIE) process.

Figure 3E:
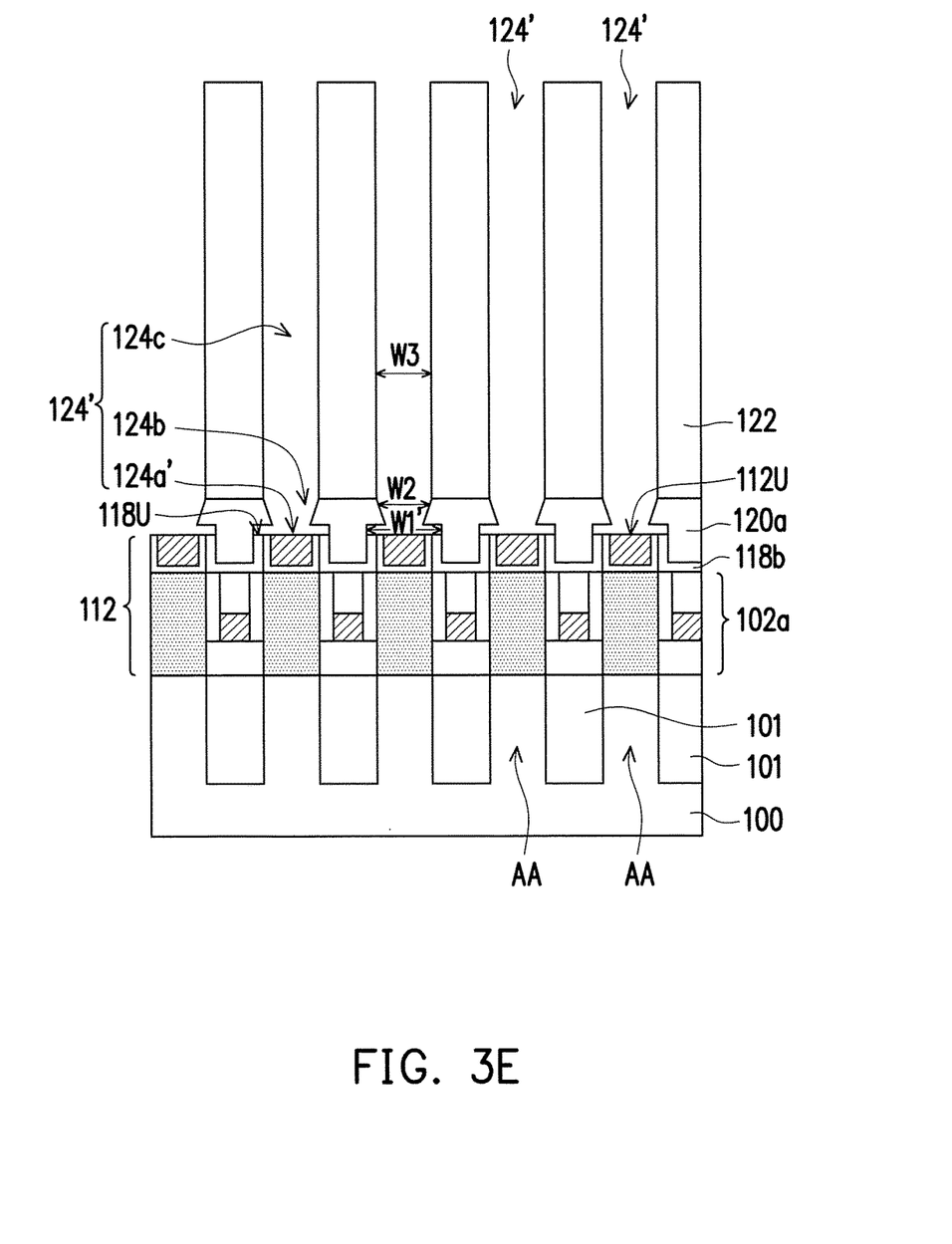

Referring to FIG. 3D and FIG. 3E, a widening etching treatment is performed to remove one portion of the first liner layer 118b exposed by the openings 124a, so that the width W1' of the widened openings 124a' is more than the width W2 of the openings 124b and more than the width W3 of the openings 124c. In some embodiments, widening etching treatment includes using an etchant with hydrofluoric acid (HF) and dilute hydrofluoric acid (DHF) to pour in the openings 124. Based on the etching selectivity, the first liner layer 118b is easily removed than the second liner layer 120a, the dielectric layer 122, and the capacitor contacts 112. As shown in FIG. 3E, the openings 124a' completely expose the upper surfaces 112U of the capacitor contacts 112, so that the upper surface 118U of the first liner layer 118 are co-planar with the upper surfaces 112U of the capacitor contacts 112.

Figure 3F:
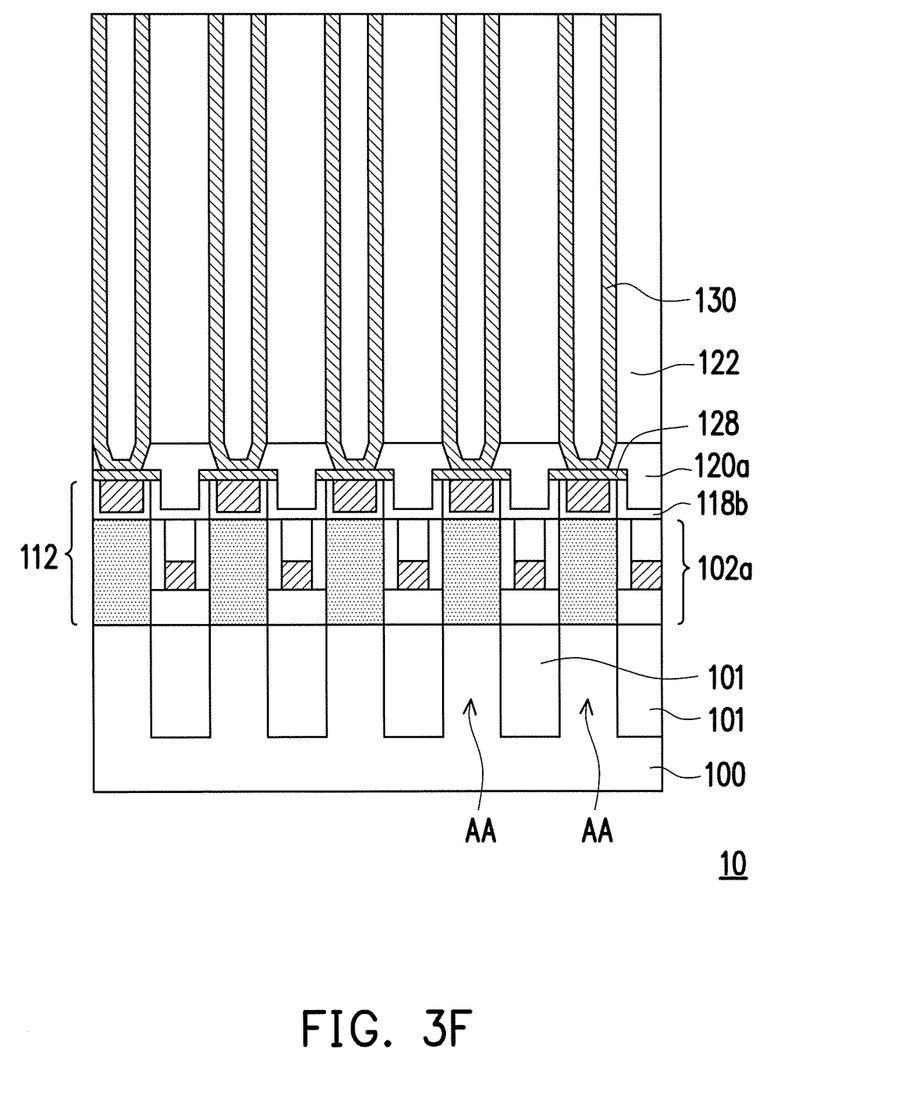

Referring to FIG. 3E and FIG. 3F, the landing pads 128 are formed in the openings 124a'. Then, the capacitors 130 are formed in the openings 124b and 124c, so that the capacitors 130 are connected to the landing pads 128. Specifically, each of the capacitors 130 includes a lower electrode, an upper electrode, and a capacitor dielectric layer (not shown). The capacitor dielectric layer is disposed between the lower electrode and the upper electrode. In some embodiments, the lower electrode and the upper electrode may include TiN, TaN, W, TiW, Al, Cu, silicide, Ru, or Pt, for example. The capacitor dielectric layer may be formed by a high-k material, such as $Ta_2O_5$, $Al_2O_3$, $HfO_2$, or $TiO_2$. The landing pads 128 may include TiN, TaN, W, TiW, Al, Cu, silicide, Ru, or Pt, for example.

Figure 4:
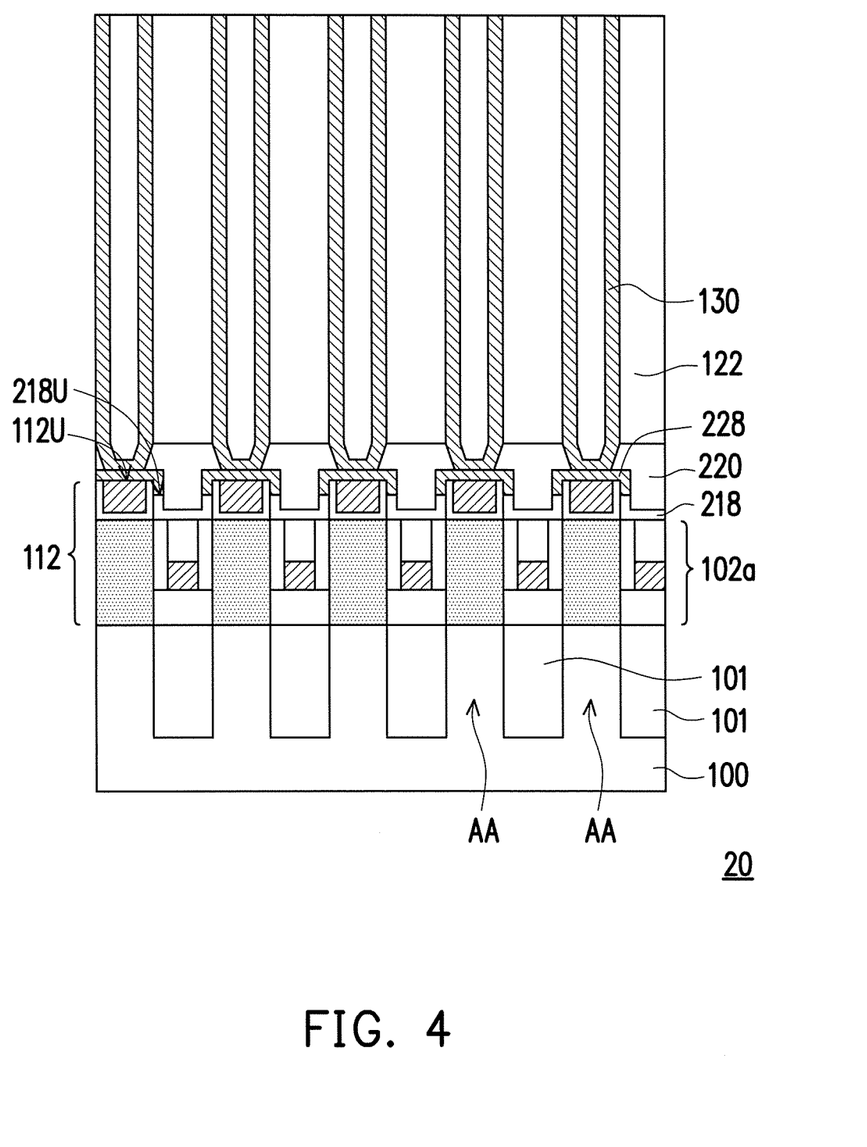
FIG. 4 is a schematic cross-sectional view of a DRAM in accordance with a second embodiment of the invention.

FIG. 4 is a schematic cross-sectional view of a DRAM in accordance with a second embodiment of the invention. Components of the second embodiment that are the same as those of the first embodiment are assigned with the same reference numerals and thus detailed descriptions thereof are omitted hereinafter. The following describes the difference therebetween.

Referring to FIG. 4, the landing pads 228 of the DRAM 20 completely cover the upper surface 112U of the capacitor contact 112 and further extend to portions of the two upper sidewalls of the capacitor contact 112 to increase the contact area between the landing pads 228 and the capacitor contacts 112. As shown in FIG. 4, the landing pads 228 may be reverse U-like. In some embodiments, the upper surface 218U of the first liner layer 218 are lower than the upper surfaces 112U of the capacitor contacts 112 and the second liner layer 220 is disposed over the first liner layer 218.

Figure 5:
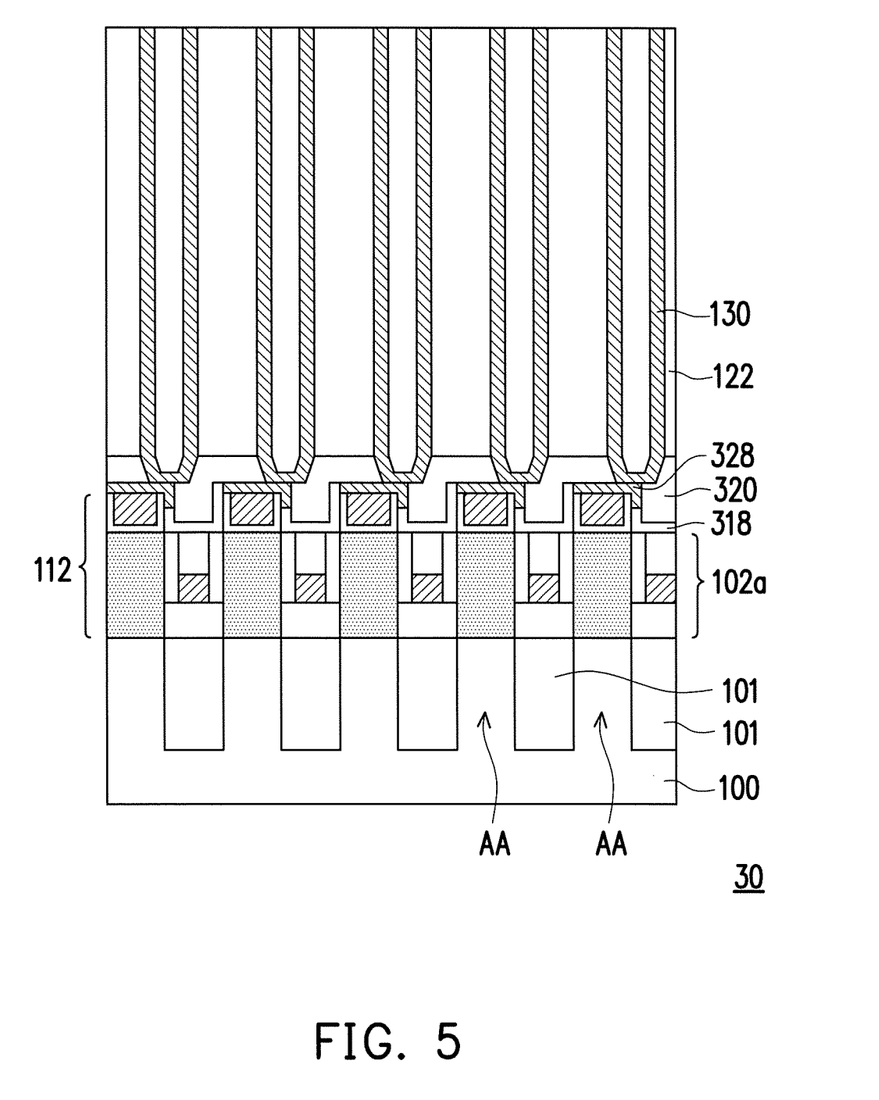
FIG. 5 is a schematic cross-sectional view of a DRAM in accordance with a third embodiment of the invention.

FIG. 5 is a schematic cross-sectional view of a DRAM in accordance with a third embodiment of the invention. Components of the third embodiment that are the same as those of the first embodiment are assigned with the same reference numerals and thus detailed descriptions thereof are omitted hereinafter. The following describes the difference therebetween.

Referring to FIG. 5, for circumstances where the capacitor 130 of the DRAM 30 offsets from the center of the capacitor contact 112, the landing pad 328 is extending to cover one of the two upper sidewalls of the capacitor contact 112, thus, the contact area between the capacitor contact 112 and the capacitor 130 is not decreased. In other words, even if the capacitor 130 is misaligned, the low contact resistance between the capacitor 130 and the capacitor contact 112 is able to be maintained. Therefore, the overlay margin between the capacitor contact 112 and the capacitor 130 is increased, while the yield and the reliability of the DRAM in the invention is enhanced. In some embodiments, as shown in FIG. 5, one of the two upper sidewalls of the capacitor contact 112 is covered by the landing pad 328 and the first liner layer 318, while another one of the two upper sidewalls of the capacitor contact 112 is only covered by the first liner layer 318 and the second liner layer 320 is disposed over the first liner layer 318.

In summary, the invention provides the DRAM and the method of manufacturing the same including forming a liner layer on a surface of the capacitor contact and removing one portion of the liner layer through a widening etching treatment. A landing pad is formed to cover an upper surface of the capacitor contact and to extend to one portion of upper sidewalls of the capacitor contact. Therefore, the contact area between the capacitor contact and the storage capacitor is increased, thereby decreasing the contact resistance between the capacitor contact and the storage capacitor. Even if the storage capacitor is misaligned, the low contact resistance is able to be maintained. Therefore, the overlay margin between the capacitor contact and the storage capacitor is increased, while the yield and the reliability of the DRAM in the invention is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory (DRAM) comprising:
    a bit line located on a substrate;
    a capacitor contact aside the bit line, wherein an upper surface of the capacitor contact is higher than an upper surface of the bit line, such that upper sidewalls of the capacitor contact are exposed by the bit line;
    a dielectric structure located on the upper surface of the bit line and extending to one portion of the upper sidewalls of the capacitor contact, wherein the dielectric structure comprises a first liner layer being partially removed for defining an opening exposing the upper surface of the capacitor contact;
    a capacitor located above and electrically contacted to the capacitor contact; and
    a landing pad formed in the opening, wherein the landing pad is located between the capacitor contact and the capacitor to electrically connect the capacitor contact and the capacitor together, the landing pad at least covers one portion of the upper surface of the capacitor contact, wherein a contact area between the landing pad and the capacitor contact is greater than a contact area between the landing pad and the capacitor.

2. The DRAM according to claim 1, wherein the landing pad completely covers the upper surface of the capacitor contact.

3. The DRAM according to claim 2, wherein the dielectric structure completely covers the upper sidewalls of the capacitor contact.

4. The DRAM according to claim 2, wherein the landing pad further extends to another portion of the upper sidewalls of the capacitor contact.

5. The DRAM according to claim 1, wherein the capacitor offsets from the center of the capacitor contact, so that the landing pad only covers one of the upper sidewalls of the capacitor contact.

6. The DRAM according to claim 1, wherein the number of the bit line is plural, the number of the capacitor contact is plural, and the number of the capacitor is plural, the capacitor contacts are respectively located between the bit lines.

7. The DRAM according to claim 1, wherein the dielectric structure further comprises a second liner layer over the first liner layer, the first liner layer is conformally formed on the bit line and the capacitor contact and a material of the first liner layer is different from a material of the second liner layer.

8. The DRAM according to claim 7, wherein the first liner layer comprises silicon oxide, the second liner layer comprises silicon nitride.

9. The DRAM according to claim 1, wherein an upper surface of the dielectric structure is higher than an upper surface of the landing pad.

10. The DRAM according to claim 1, wherein a height difference between the upper surface of the capacitor contact and the upper surface of the bit line is 10 nm to 50 nm.

11. The DRAM according to claim 1, wherein the capacitor contact comprises a first portion and a second portion over the first portion, and a material of the first portion is different from a material of the second portion.

12. The DRAM according to claim 11, wherein the first portion comprises poly-Si, SiGe, SiC or a combination thereof, the second portion comprises W, TiN, TaN or a combination thereof.

13. A method of manufacturing a dynamic random access memory (DRAM) comprising:
    forming a plurality of bit lines on a substrate;
    forming a plurality of capacitor contacts respectively between the bit lines, wherein an upper surface of each of the capacitor contacts is higher than an upper surface of each of the bit lines, such that a plurality of recesses are respectively formed on the plurality of the bit lines between the capacitor contacts;
    forming a first liner layer on the substrate, wherein the first liner layer conformally covers the upper surfaces of the capacitor contacts and the recesses;
    forming a second liner layer on the first liner layer, wherein the recesses are filled with the second liner layer;
    forming a dielectric layer on the second liner layer;
    forming a plurality of first openings in the first liner layer and forming a plurality of second openings in the dielectric layer and the second liner layer, the second openings respectively located over and connected to the first openings, wherein each of the first openings exposes one portion of the upper surface of a respective capacitor contact and a width of each of the first openings is greater than a width of each of the second openings;
    forming a plurality of landing pads in the first openings; and
    forming a plurality of capacitors in the second openings, wherein a contact area between each of the landing pads and a respective capacitor contact is greater than a contact area between each of the landing pad and a respective capacitor.

14. The method of manufacturing the DRAM according to claim 13, wherein steps of forming the first openings and second openings comprises:
    performing an etching process to form a plurality of third openings in the dielectric layer, the second liner layer, and the first liner layer, wherein each of the third openings has a uniform width or a taper width; and
    performing a widening etching treatment to remove one portion of the first liner layer exposed by the third openings.

15. The method of manufacturing the DRAM according to claim 14, wherein the etching process comprises a dry etching process, the dry etching process comprises reactive ion etching (RIE) process.

16. The method of manufacturing the DRAM according to claim 14, wherein the widening etching treatment comprises using an etchant with hydrofluoric acid (HF) and dilute hydrofluoric acid (DHF).

17. The method of manufacturing the DRAM according to claim 13, wherein the first openings completely expose the upper surfaces of the capacitor contacts.

18. The method of manufacturing the DRAM according to claim 13, wherein the first openings completely expose the upper surfaces of the capacitor contacts, so that an upper surface of the first liner layer are co-planar with the upper surfaces of the capacitor contacts.

19. The method of manufacturing the DRAM according to claim 13, wherein the first openings completely expose the upper surfaces of the capacitor contacts and one portion of upper sidewalls of the capacitor contacts, so that an upper surface of the first liner layer are lower than the upper surfaces of the capacitor contacts.

20. The method of manufacturing the DRAM according to claim 13, wherein each of the second openings is offset from the center of a respective capacitor contact, so that each of the first openings only exposes one of the upper sidewalls of the respective capacitor contact.

* * * * *